(12) United States Patent
Hsieh

(10) Patent No.: US 11,018,028 B2
(45) Date of Patent: May 25, 2021

(54) METHOD OF APPLYING CONDUCTIVE ADHESIVE AND MANUFACTURING DEVICE USING THE SAME

(71) Applicant: EPISTAR CORPORATION, Hsinchu (TW)

(72) Inventor: Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 261 days.

(21) Appl. No.: 16/183,435

(22) Filed: Nov. 7, 2018

(65) Prior Publication Data
US 2020/0144077 A1 May 7, 2020

(51) Int. Cl.
*H01L 21/48* (2006.01)
*H01L 23/00* (2006.01)
(Continued)

(52) U.S. Cl.
CPC .......... *H01L 21/4867* (2013.01); *H01L 24/29* (2013.01); *H01L 24/32* (2013.01); *H01L 24/83* (2013.01); *B23K 1/0016* (2013.01); *B23K 3/0623* (2013.01); *H01L 24/28* (2013.01); *H01L 24/741* (2013.01); *H01L 24/742* (2013.01); *H01L 24/743* (2013.01); *H01L 24/75* (2013.01); *H01L 24/81* (2013.01); *H01L 2224/11003* (2013.01); *H01L 2224/1132* (2013.01); *H01L 2224/13015* (2013.01); *H01L 2224/27003* (2013.01); *H01L 2224/2732* (2013.01); *H01L 2224/29015* (2013.01); *H01L 2224/32227* (2013.01);
(Continued)

(58) Field of Classification Search
CPC ......... H01L 21/4867; H01L 2224/2732; H01L 2224/1132; H01L 2224/83851; H01L 2224/756; H01L 2224/7615; H01L 2224/76151; H01L 2224/7617; H01L 2224/7665; H01L 2224/76821; H01L 2224/75743; H01L 2224/75745; H01L 24/28; H01L 24/741; H01L 24/742; H01L 24/743; H01L 24/75; B23K 1/0016; B23K 3/0623
See application file for complete search history.

(56) References Cited

U.S. PATENT DOCUMENTS 5,643,831 A * 7/1997 Ochiai ................ H01L 21/6835
                                                            438/616
6,025,258 A * 2/2000 Ochiai .................. H01L 24/742
                                                            438/613
(Continued)

FOREIGN PATENT DOCUMENTS

CN    203091910 U    7/2013
TW    201709220 A    3/2017

*Primary Examiner* — David A Zarneke
(74) *Attorney, Agent, or Firm* — Muncy, Geissler, Olds and Lowe, P.C.

(57) ABSTRACT

An applying method includes the following steps. Firstly, a conductive adhesive including a plurality of conductive particles and an insulating binder is provided. Then, a carrier plate is provided. Then, a patterned adhesive is formed on the carrier plate by the conductive adhesive, wherein the patterned adhesive includes a first transferring portion. Then, a manufacturing device including a needle is provided. Then, the needle of the manufacturing device is moved to contact the first transferring portion. Then, the transferring portion is transferred to a board by the manufacturing device.

15 Claims, 9 Drawing Sheets

(51) Int. Cl.
  *B23K 3/06*         (2006.01)
  *B23K 1/00*         (2006.01)
(52) U.S. Cl.
  CPC ............... *H01L 2224/7501* (2013.01); *H01L 2224/756* (2013.01); *H01L 2224/75743* (2013.01); *H01L 2224/75745* (2013.01); *H01L 2224/7615* (2013.01); *H01L 2224/7617* (2013.01); *H01L 2224/7665* (2013.01); *H01L 2224/76151* (2013.01); *H01L 2224/76821* (2013.01); *H01L 2224/83851* (2013.01)

(56) References Cited

U.S. PATENT DOCUMENTS

| | | | | |
|---|---|---|---|---|
| 6,051,448 | A * | 4/2000 | Hayama | H01F 41/043 |
| | | | | 438/108 |
| 6,103,551 | A * | 8/2000 | Ono | H01L 21/563 |
| | | | | 257/E21.503 |
| 6,429,114 | B1 * | 8/2002 | Hayama | H01L 21/4867 |
| | | | | 257/E21.503 |
| 6,808,578 | B2 * | 10/2004 | Hashimoto | H01L 21/4857 |
| | | | | 156/233 |
| 6,936,532 | B2 * | 8/2005 | Sakaida | H01L 21/6835 |
| | | | | 438/616 |
| 7,674,651 | B2 * | 3/2010 | Oyama | H01L 24/11 |
| | | | | 438/106 |
| 7,897,059 | B2 * | 3/2011 | Indyk | B23K 1/0016 |
| | | | | 216/103 |
| 8,033,016 | B2 * | 10/2011 | Hibino | H01L 24/81 |
| | | | | 29/852 |

* cited by examiner

METHOD OF APPLYING CONDUCTIVE ADHESIVE AND MANUFACTURING DEVICE USING THE SAME

TECHNICAL FIELD

The disclosure relates in general to a method of applying an adhesive material to an object and a manufacturing device using the same, and more particularly to a method and a manufacturing device of applying a conductive adhesive to an object.

BACKGROUND

In conventional methods of bonding a semiconductor element to a circuit substrate, one of the methods is by applying conductive adhesive. In general, conductive adhesive is directly formed on a pad of the circuit board by dispensing or printing. However, it is difficult to control the amount of each conductive adhesive formed on the corresponding pad of the circuit board, and thus an electrical short-circuit may incur in adjacent two pads of the circuit board. Thus, how to resolve the problem of inaccurate amount of the conductive adhesive formed on the circuit board is an important issue.

SUMMARY

According to an embodiment, a method of applying a sticky/adhesive material to an object is provided. The method includes following steps. A conductive adhesive with a plurality of conductive particles and an insulating binder is provided; a carrier plate is provided; a patterned adhesive is formed on the carrier plate by patterning the conductive adhesive, wherein the patterned adhesive includes a first transferring portion; a manufacturing device including a needle is provided; the needle of the manufacturing device is moved to contact the first transferring portion; and the transferring portion is transferred to a board by the manufacturing device.

According to another embodiment, an applying method is provided. A carrier plate is provided; a patterned adhesive is formed on the carrier plate, wherein the patterned adhesive includes a conductive adhesive, and has a first transferring portion and a second transferring portion; a manufacturing device is provided and includes a first needle and a second needle; the first needle is moved to contact the first transferring portion and the second needle is moved to contact the second transferring portion; and the first transferring portion and the second transferring portion are transferred to a board.

According to one embodiment, a manufacturing device is provided. The manufacturing device includes a plate and a plurality of capturing components. The capturing components are disposed on the plate, wherein each capturing component includes a base, a needle, a scraping portion and an elastic portion. The needle is fixed to the base. The elastic portion is disposed between the scraping portion and the base. The scraping portion is movably disposed on the base for scraping a transferring portion from the needle.

Figure 1:
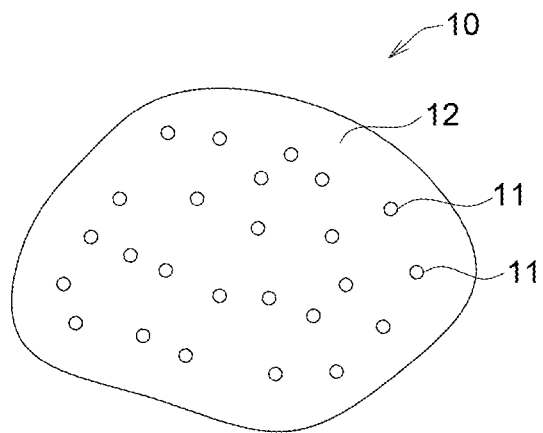
FIG. 1 illustrates a conductive adhesive according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

FIGS. 1 to 11 illustrate applying method according to an embodiment of the present invention.

As shown in FIG. 1, a conductive adhesive 10 including a number of conductive particles 11 that is dispersed in an insulating binder 12 is provided. In an embodiment, the conductive particles 11 are solder balls, for example, and the insulating binder 12 is epoxy, for example. In an embodiment, material of the conductive particles 11 is made of an alloy with low liquidus melting point. In one embodiment, the liquidus melting point of the conductive particles 11 is less than 210° C. In another embodiment, the liquidus melting point of the conductive particles 11 is less than 170° C. In one embodiment, each conductive particle 11 has a micro-size diameter. The diameter of the conductive particle 11 is ranging from 0.5 micrometer (μm) to 20 μm, for example. In another embodiment, the diameter of the conductive particle 11 is ranging from 1 μm to 10 μm. The conductive particles 11 have a weight percentage, for example, from 20 wt % to 60 wt % in the conductive adhesive 10. In an embodiment, the conductive adhesive 10 may be, for example, SAP (Self Assembly Anisotropic Conductive Paste).

Figure 2:
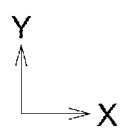
FIG. 2 illustrates a carrier according to one embodiment.
Figure 2:

As shown in FIG. 2, a carrier plate 20 is provided. The carrier plate 20 can serve as a temporary substrate. The carrier plate 20 has an upper surface 20s. In an embodiment, the upper surface 20s is a flat surface for carrying the conductive adhesive 10.

Figure 3A:
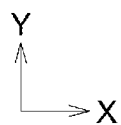
FIG. 3A illustrates a screen plate according to one embodiment.
Figure 3A:
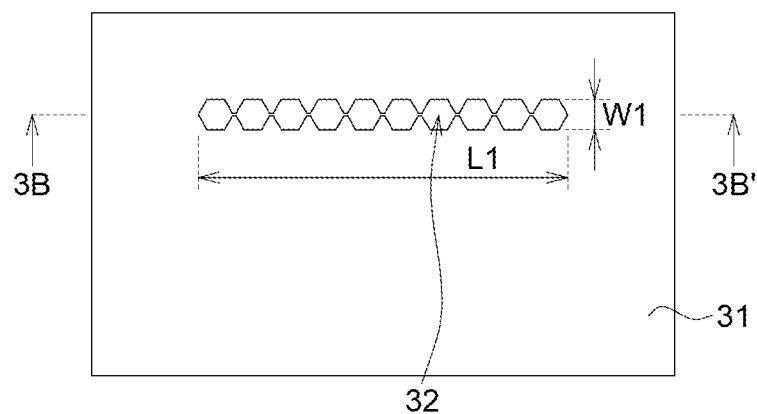
Figure 3B:
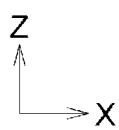
FIG. 3B is a cross-sectional view of the screen plate of FIG. 3A along a line 3B-3B'.
Figure 3B:
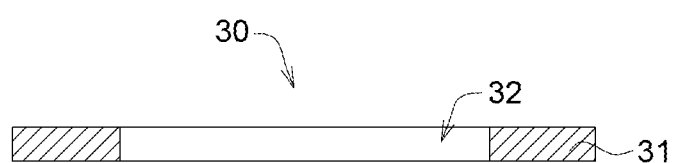

As shown in FIGS. 3A and 3B, a screen plate 30 is provided. The screen plate 30 includes a plate body 31 and at least one opening 32 penetrating the plate body 31. In an embodiment, a number of the openings 32 may be arranged in a pattern. For example, the openings 32 may be arranged along a direction parallel to or perpendicular to an extension direction, for example, X direction. In an embodiment, the opening 32 is formed by way of, for example, laser. The opening 32 has a width W1 ranging between 10 μm to 150 μm and a length L1 ranging between 10 millimeters (mm) to 30 mm.

Figure 4A:
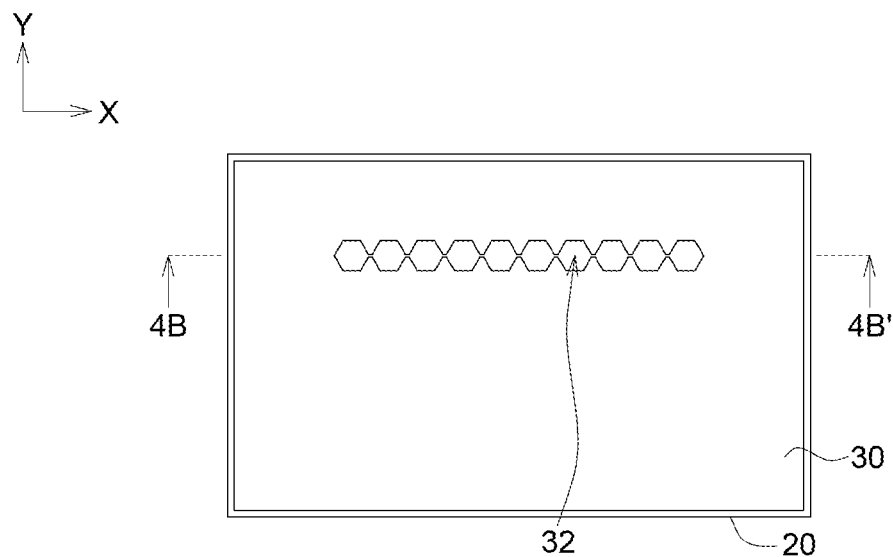
FIG. 4A is a top view of the screen plate of FIG. 3B disposed adjacent to and opposite to the carrier plate of FIG. 2.
Figure 4B:
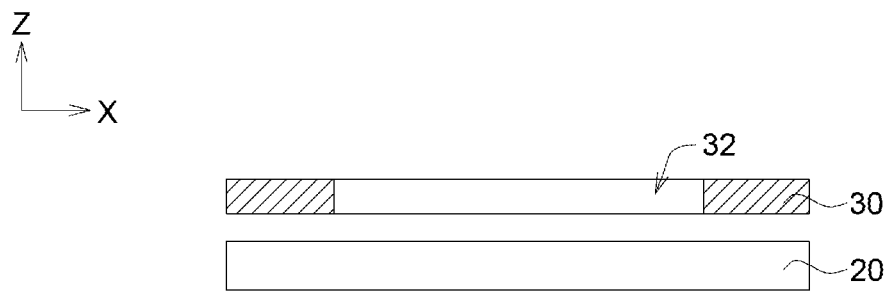
FIG. 4B is a cross-sectional view of the screen plate of FIG. 4A along a direction 4B-4B'.

As shown in FIGS. 4A and 4B, the screen plate 30 is disposed adjacent to and opposite to the carrier plate 20.

Figure 5:
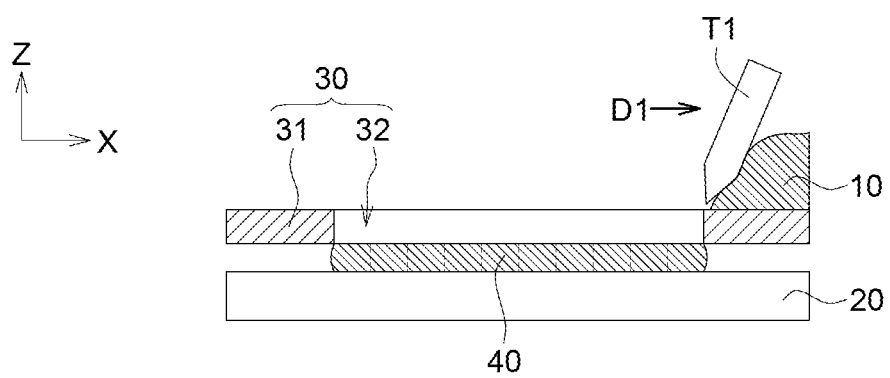
FIG. 5 illustrates patterned adhesive formed on the carrier plate through the screen plate.

As shown in FIG. 5, in an embodiment, a patterned adhesive 40 is formed on the carrier plate 20 by pushing the conductive adhesive 10 through the opening 32, so that the patterned adhesive 40 is formed by a portion of the conductive adhesive 10. Furthermore, the patterned adhesive 40 is provided in a linear arrangement. In detail, a scraper T1 forces the conductive adhesive 10 to pass through the opening 32 in a scraping direction D1 as to form the patterned adhesive 40 on the carrier plate 20. Because the patterned adhesive 40 is formed through the opening 32, the patterned adhesive 40 has geometric shape identical or similar to that of the opening 32.

Figure 6A:
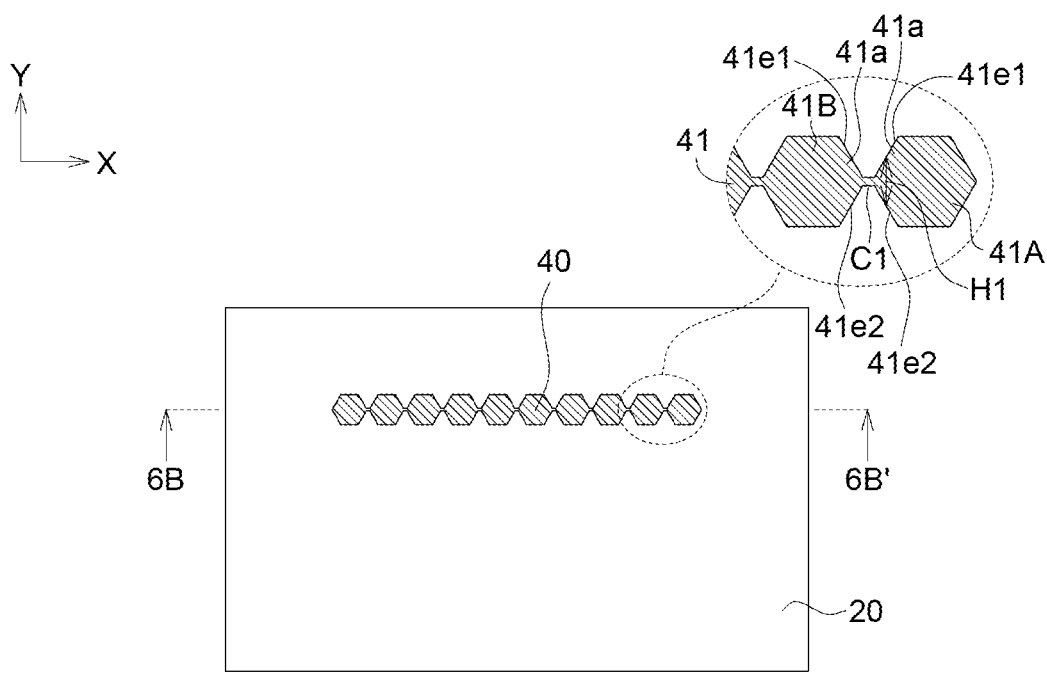
FIG. 6A is a top view of the patterned adhesive formed on the carrier plate.
Figure 6B:
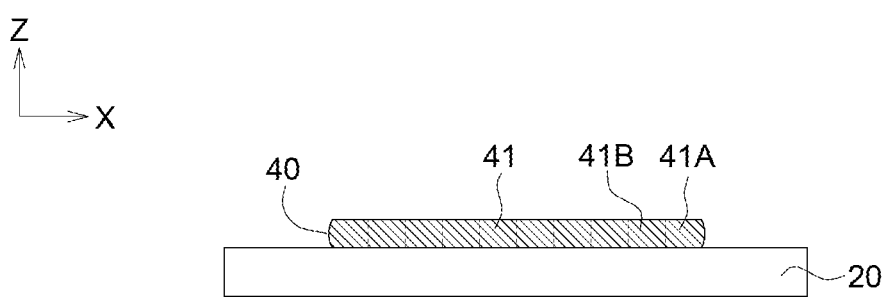
FIG. 6B is a cross-sectional view of the screen plate of FIG. 6A along a line 6B-6B'.

As shown in FIGS. 6A and 6B, the screen plate 30 is removed. As shown in FIG. 6A, the patterned adhesive 40 includes a number of transferring portions 41. The patterned adhesive 40 has a shape which is the same as that of the pattern of the opening 32. Each transferring portion 41 includes a neck portion 41a, wherein the neck portion 41a of one of the transferring portions 41 connects with the neck portion 41a of adjacent transferring portions 41. In another embodiment, all the transferring portions 41 are separated from each other. In other words, no neck portion is formed between any two adjacent transferring portions 41.

As shown In FIG. 6A, one of the transferring portions 41 (for example, first transferring portion 41A) connects with adjacent transferring portion 41 (for example, second transferring portion 41B) in a connection portion C1, each transferring portion 41 has a first edge 41e1 and a second edge 41e2, a distance H1 between the first edge 41e1 and the second edge 41e2 decreases along a direction toward the connection portion C1. As a result, the first edge 41e1 and the second edge 41e2 of each transferring portion 41 constitute the neck portion 41a.

Figure 7A:
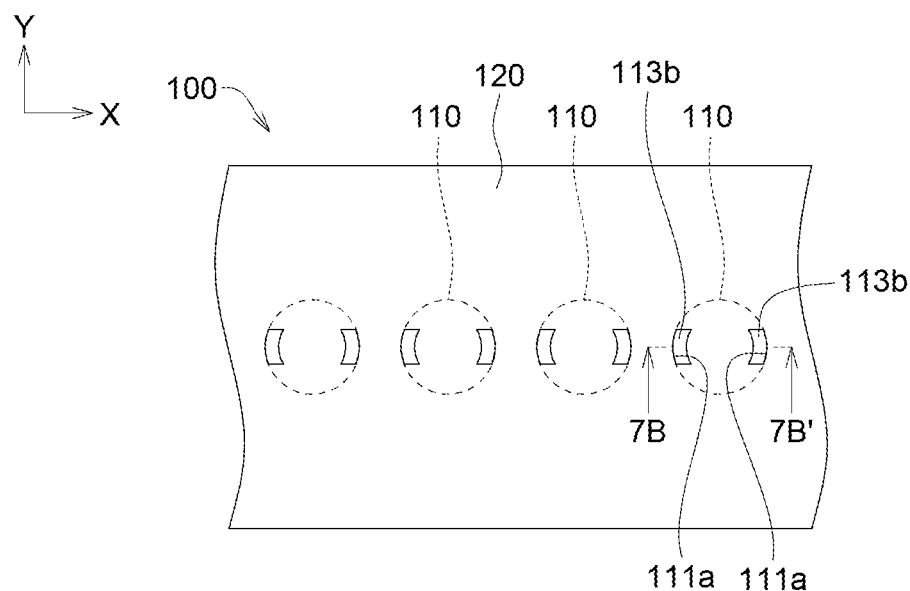
FIG. 7A is a top view of a manufacturing device according to one embodiment.
Figure 7B:
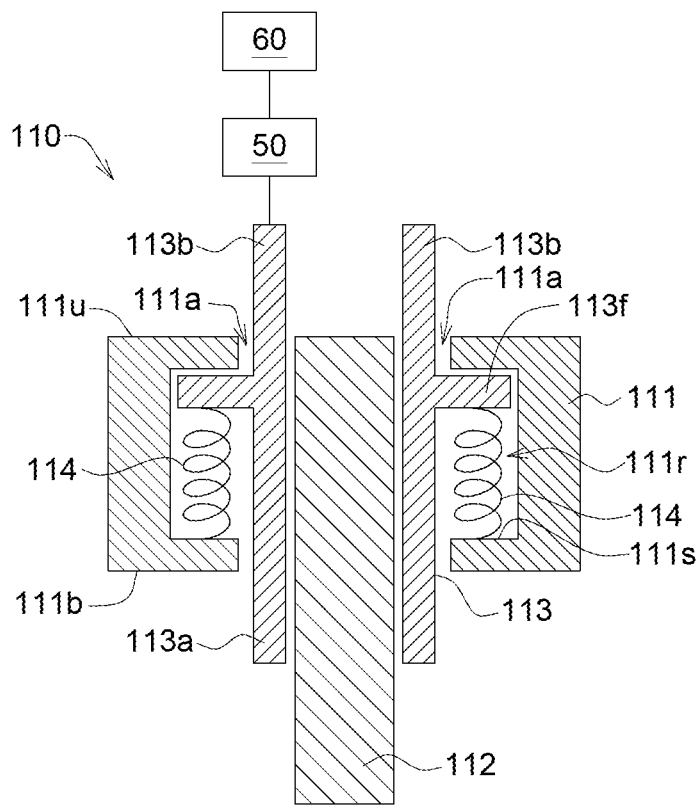
FIG. 7B is a cross-sectional view of the manufacturing device of FIG. 7A along a line 7B-7B'.

As shown in FIGS. 7A and 7B, a manufacturing device 100 is provided. In one embodiment, the manufacturing device 100 includes a number of capturing component 110 and a plate 120, wherein the capturing component 110 are disposed on or within the plate 120. Each capturing component 110 includes a base 111, a needle 112, a scraping portion 113 and at least one elastic portion 114. The base 111 has a receiving portion 111r for receiving the scraping portion 113 and the elastic portions 114. The needle 112 is fixed to the base 111. For example, the needle 112 and the base 111 may be integrated into one piece in the same manufacturing process. The elastic portion 114 is, for example, spring.

The base 111 has a lower surface 111b and an upper surface 111u. The needle 112 is projected from the lower surface 111b for contacting or capturing at least one transferring portion 41 (not illustrated in FIGS. 7A and 7B). The scraping portion 113 is movably disposed in the receiving portion 111r for scraping the transferring portion 41 from the needle 112. The elastic portions 114 are disposed between a flange 113f of the scraping portion 113 and a bottom surface 111s of the receiving portion 111r of the base 111 for providing the scraping portion 113 with an elastic-restoring force during the scraping portion 113 moving up and down.

In addition, the scraping portion 113 includes a scraping segment 113a and at least one projection 113b. The scraping segment 113a can scrape the transferring portion 41 (not illustrated in FIGS. 7A and 7B) from the needle 112. The base 111 further has at least one through hole 111a, and each projection 113b passes through the corresponding through hole 111a to be projected from the upper surface 111u for connecting with a first actuator device 50. The first actuator device 50 may push the projection 113b to move downward, such that the scraping segment 113a can scrape the transferring portion 41 from the needle 112. In addition, a control device 60 is electrically connected to the first actuator device 50 for controlling the first actuator device 50 to push at least one scraping portion 113.

Figure 8:
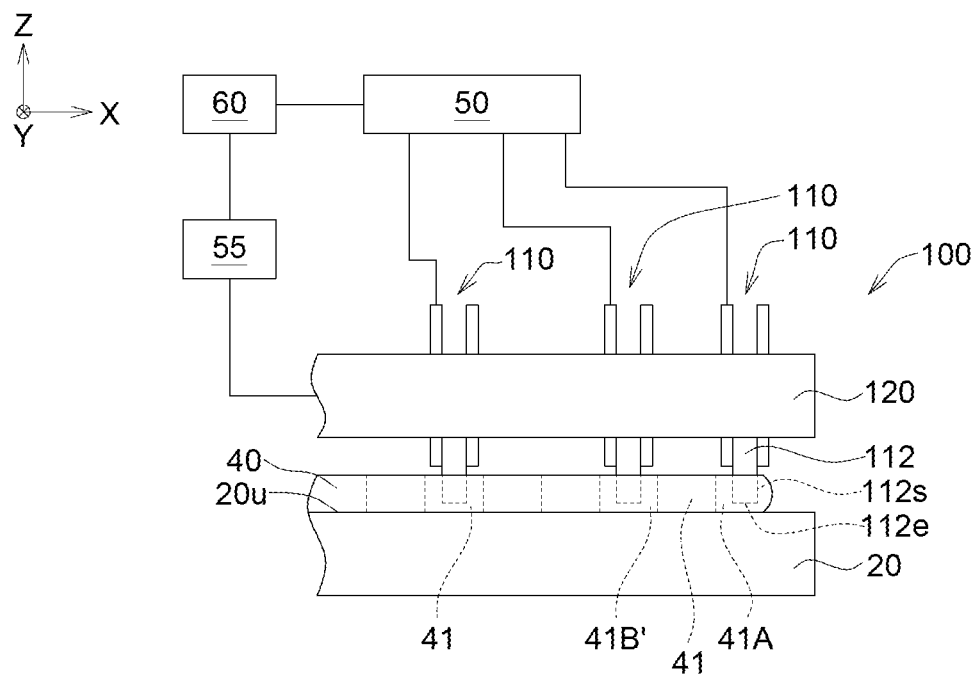
FIG. 8 illustrates the manufacturing device being adjacent to opposite to the carrier plate.

As illustrated in FIG. 8, a second actuator device 55 connects with the plate 120 of the manufacturing device 100, and the control device 60 is electrically connected to the second actuator device 55 for controlling the second actuator device 55 to drive the plate 120 to move with respect to the carrier plate 20 in the Z direction or in a plane X-Y, wherein the plane X-Y is, for example, parallel to a surface 20u on which the patterned adhesive 40 is formed, and Z direction is, for example, vertical to the surface 20u. As shown in FIG. 8, the control device 60 controls the second actuator device 55 to drive the plate 120 to move, such that the capturing components 110 are corresponding to a number of the transferring portions 41 respectively in Z direction. Then, the control device 60 controls the second actuator device 55 to drive the plate 120 to move, such that the needle 112 of each capturing component 110 can contact or capture the corresponding transferring portion 41 (for example, a first transferring portion 41A and a second transferring portion 41B'). For example, the needles 112 are inserted into the captured transferring portion 41, such that each captured transferring portions 41 adheres to a lateral surface 112s and/or a terminal 112e of the corresponding needle 112. In another embodiment, after the plate 120 is lowered to a certain height, the needles 112 may move along the Y direction to contact the captured transferring portions 41, such that each captured transferring portions 41 adheres to a lateral surface 112s and/or a terminal 112e of the corresponding needle 112.

Figure 9:
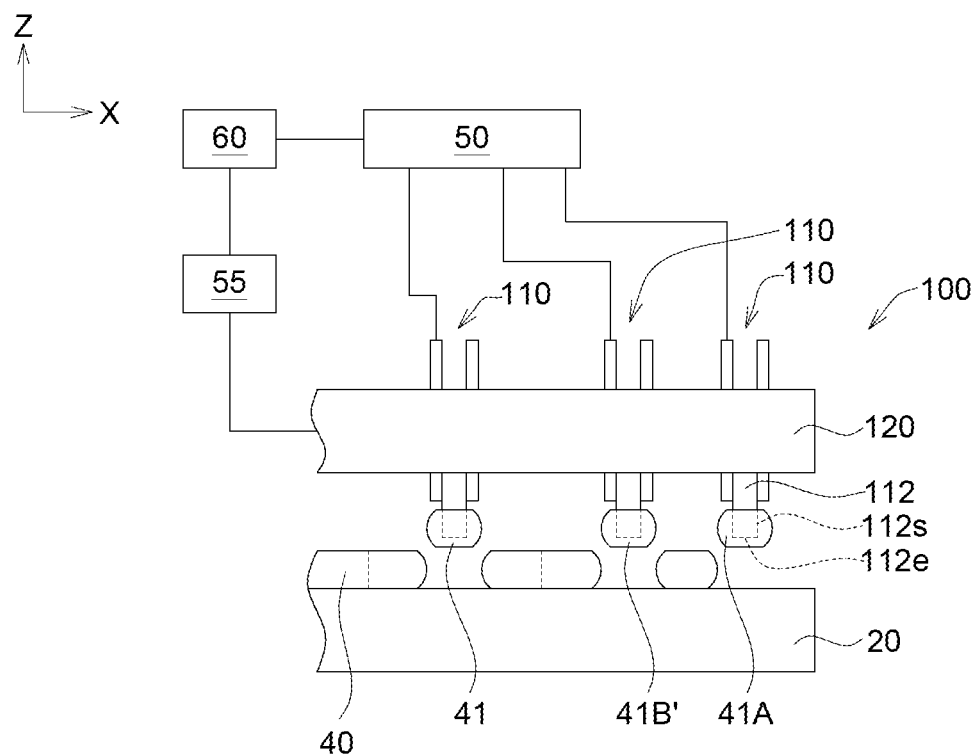
FIG. 9 illustrates the manufacturing device capturing a number of transferring portions.
Figure 10:
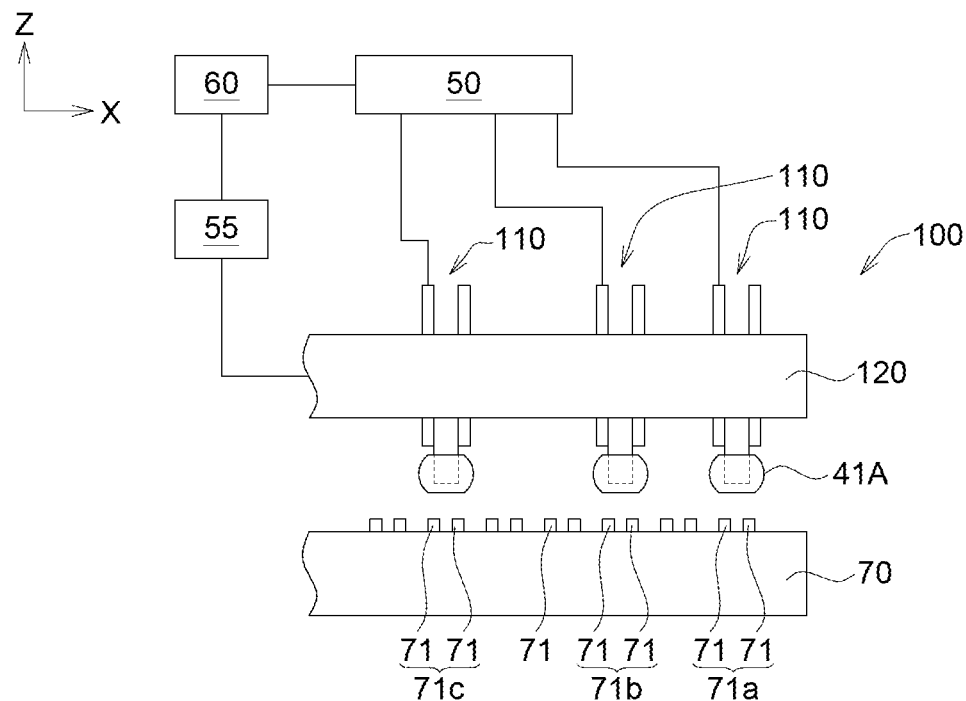
FIG. 10 illustrates the manufacturing device capturing the transferring portions.

As illustrated in FIG. 9, the control device 60 controls the second actuator device 55 to drive the plate 120 of the manufacturing device 100 to move away from the carrier plate 20. After moving, the needle 112 of each capturing component 110 captures the corresponding transferring portion 41 with a fixed amount on its lateral surface 112s, wherein the captured transferring portions 41 are separated from each other. Due to the amount of each captured transferring portion 41 being substantially identical, it can prevent from the captured transferring portion 41 placed on at least one pad 71 of a circuit board 70 (the circuit board 70 is illustrated in FIG. 10) being deviated from the pad 71. In the other words, it can increase the accuracy of each volume in the captured transferring portion 41 to each the pad 71 (the pad 71 is illustrated in FIG. 10).

As illustrated in FIG. 10, the control device 60 controls the second actuator device 55 to drive the manufacturing device 100 to be located above the circuit board 70, such that each transferring portion 41 captured by the corresponding capturing component 110 is corresponding to the corresponding pad group in Z direction.

The circuit board 70 includes a number of the pads 71 including a first pad group 71a, a second pad group 71b and a third pad group 71c, wherein the first pad group 71a, the second pad group 71b and the third pad group 71c are respectively for being electrically connected to one electronic component or server electronic components, for example, chip, semiconductor package, etc.

Figure 11:
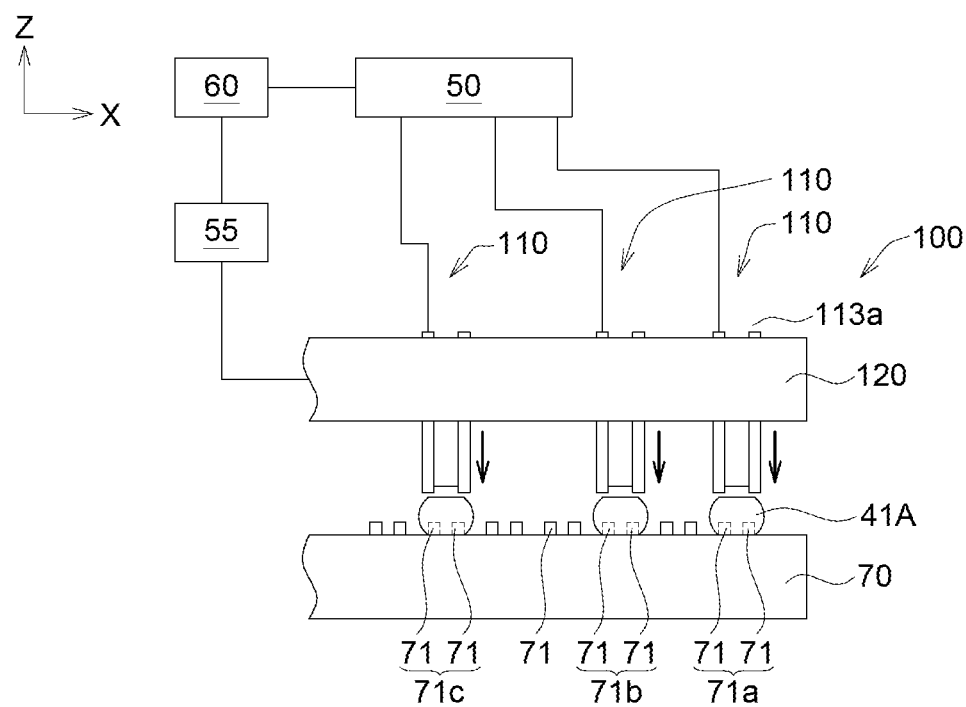
FIG. 11 illustrates the transferring portions being placed to a circuit board.

As illustrated in FIG. 11, the control device 60 controls the first actuator device 50 to push the projection 113b to move downward, such that the scraping segment 113a scrapes the captured transferring portion 41 from the needle 112. Each scraped transferring portion 41 is adhered to and covers the corresponding pads 71. After the control device 60 controls the first actuator device 50 to release the projection 113b, the elastic-restoring force applied by the elastic portion 114 forces the scraping portion 113 to be restored to free position, as the position shown in FIG. 7B, 8 or 9.

Figure 12:
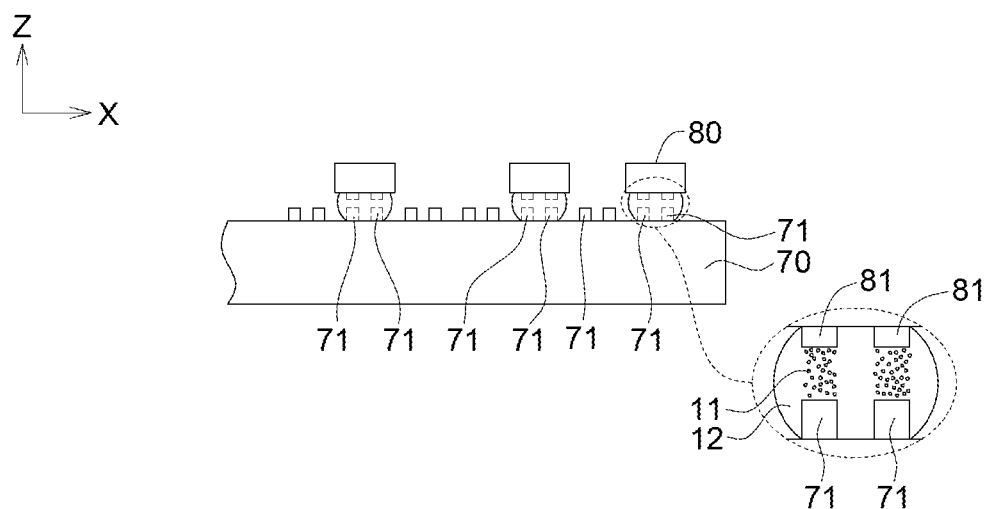
FIG. 12 illustrates a number of electronic component being disposed on the transferring portions.

As illustrated in FIG. 12, a number of electronic components 80 are disposed on the scraped transferring portions 41 respectively. Each electronic component 80 includes a number of contacts 81, and the contacts 81 of each electronic component 80 are corresponding to the pad 71 in Z direction.

Then, the circuit board 70 and the scraped transferring portions 41 are heated. During heating, the conductive particles 11 are concentrated and melted between the corresponding contact 81 and pad 71 for being electrically connected the corresponding contact 81 and pad 71. After solidified and curing, the connected conductive particles 11 are solidified and the insulating binder 12 is cured so the conductive particles become one conductive bump (not illustrated) connecting the corresponding contact 81 and pad 71, and adjacent two conductive bumps are separated and fixed by the insulating binder 12 and do not connect with each other.

Figure 13:
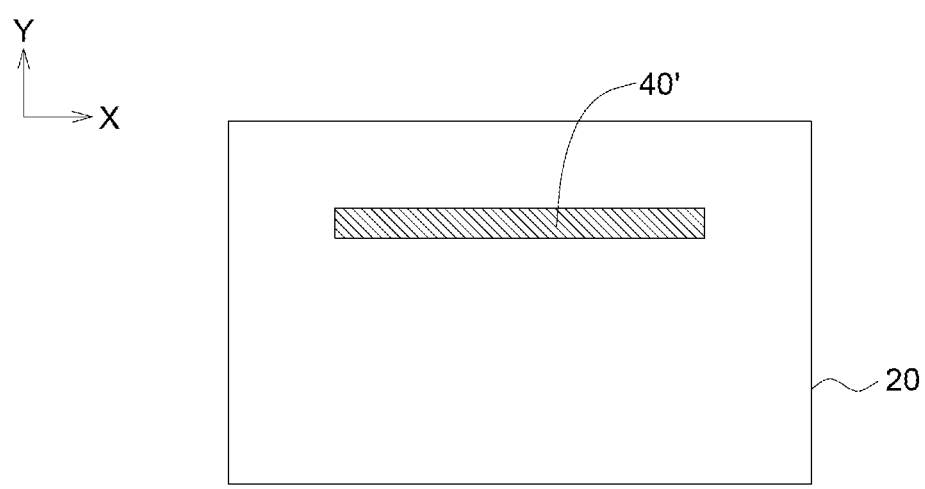
FIGS. 13 to 15 illustrate the patterned adhesives according to plural embodiments.
Figure 14:
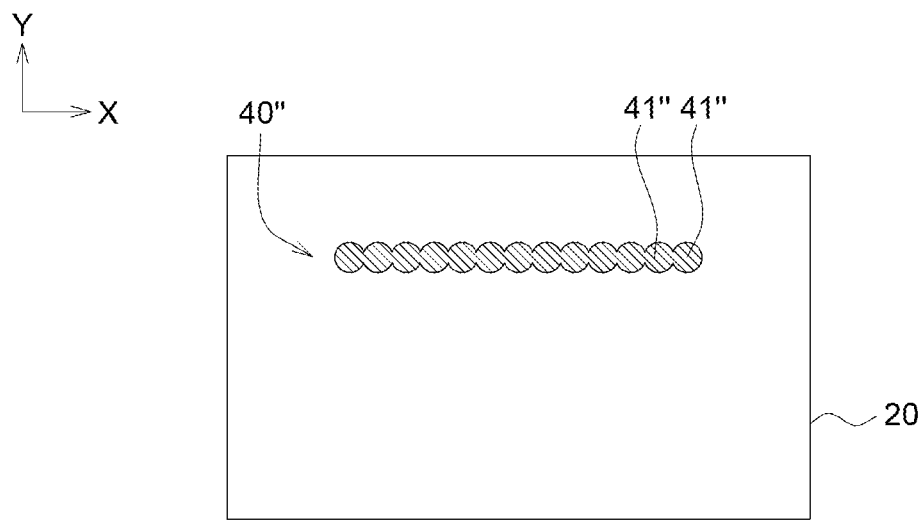
Figure 15:
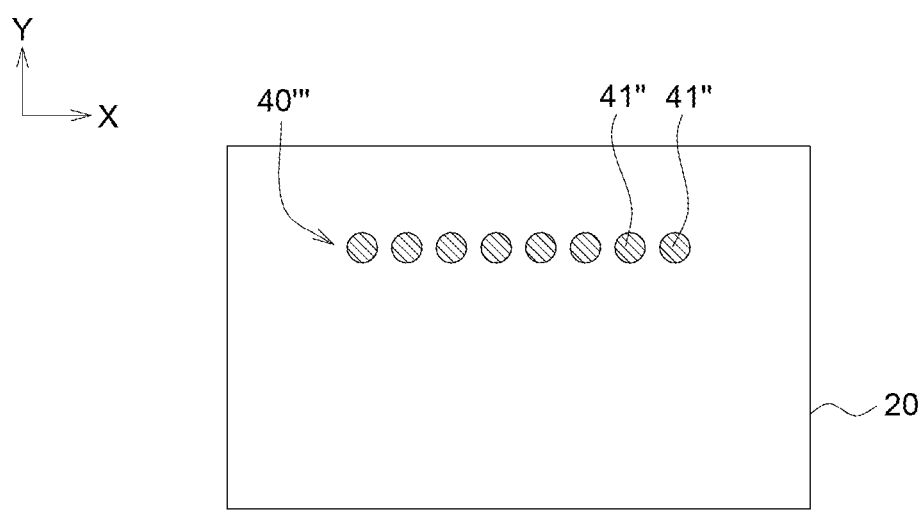

FIGS. 13 to 15 illustrate diagrams of the patterned adhesives according to plural embodiments.

As illustrated in FIG. 13, a patterned adhesive 40' is provided in a single stripe. As illustrated in FIG. 14, a patterned adhesive 40" includes a plurality transferring portions 41", wherein the transferring portions 41" are connected with each other. In the present embodiment, each transferring portions 41" is circular shape, for example. As illustrated in FIG. 15, a patterned adhesive 40''' includes a plurality transferring portions 41", wherein the transferring portions 41" are separated from each other. In another embodiment, the transferring portions 41" may be polygonal shape, oval shape, or other shape.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An applying method, comprises:
providing a conductive adhesive comprising a plurality of conductive particles and an insulating binder;
providing a carrier plate;
forming a patterned adhesive on the carrier plate by the conductive adhesive, wherein the patterned adhesive comprises a first transferring portion;
providing a manufacturing device comprising a needle;
moving the needle to contact the first transferring portion; and
transferring, by the manufacturing device, the first transferring portion to a board.

2. The applying method according to claim 1, further comprises:
providing a screen plate having an opening, wherein the opening has an opening pattern with a shape which is the same as that of the patterned adhesive.

3. The applying method according to claim 1, wherein the patterned adhesive comprises a second transferring portion adjacent to the first transferring portion.

4. The applying method according to claim 3, wherein the first transferring portion comprises a first neck portion, and the second transferring portion comprises a second neck portion which connects to the first neck portion.

5. The applying method according to claim 3, further comprising a connection portion, wherein the first transferring portion connects with the second transferring portion in the connection portion.

6. The applying method according to claim 5, wherein the first transferring portion comprises a first edge and a second edge, and a distance between the first edge and the second edge gets smaller toward the connection portion.

7. The applying method according to claim 3, wherein the first transferring portion has an amount which is the same as that of the second transferring portion.

8. The applying method according to claim 1, wherein the patterned adhesive is configured to be provided in a linear arrangement.

9. The applying method according to claim 1, wherein the manufacturing device comprises a plate and a capturing component disposed on the plate, wherein the capturing component comprises the needle, a base, elastic portion and a scraping portion.

10. The applying method according to claim 9, wherein the needle is fixed to the base, and the elastic portion is disposed between the scraping portion and the base.

11. The applying method according to claim 9, wherein in step of moving the needle to contact the first transferring portion further comprises:
driving the plate to move, such that the needle is corresponding to the first transferring portion; and
driving the plate to move, such that the needle contacts the first transferring portion.

12. The applying method according to claim 9, wherein the board comprises a pad, and in step of transferring, by the manufacturing device, the first transferring portion to the board comprises:
driving the manufacturing device to be located above the board, such that first transferring portion captured by the capturing component is corresponding to the pad; and
pushing the scraping portion move downward, such that the scraping portion scrapes the first transferring portion from the needle.

13. An applying method, comprises:
providing a carrier plate;
forming a patterned adhesive on the carrier plate, wherein the patterned adhesive comprises a conductive adhesive, and has a first transferring portion and a second transferring portion;
providing a manufacturing device comprising a first needle and a second needle;
moving the first needle to contact the first transferring portion and the second needle to contact the second transferring portion; and
transferring the first transferring portion and the second transferring portion to a board.

14. The applying method according to claim 13, wherein the conductive adhesive comprises a plurality of conductive particles and an adhesive insulating binder.

15. The applying method according to claim 14, further comprising heating the first transferring portion and the second transferring portion to melt the plurality of conductive particles and to cure the insulating binder.

* * * * *